US008330323B2

(12) United States Patent
Zalalutdinov et al.

(10) Patent No.: US 8,330,323 B2
(45) Date of Patent: *****Dec. 11, 2012

(54) THERMAL-MECHANICAL SIGNAL PROCESSING

(75) Inventors: Maxim Zalalutdinov, Silver Springs, MD (US); Robert B. Reichenbach, Portland, OR (US); Keith Aubin, Coventry, RI (US); Brian H. Houston, Fairfax, VA (US); Jeevak M. Parpia, Ithaca, NY (US); Harold G. Craighead, Ithaca, NY (US)

(73) Assignees: Cornell Research Foundation, Inc., Ithaca, NY (US); Naval Research Laboratory, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/292,658

(22) Filed: Nov. 9, 2011

(65) Prior Publication Data

US 2012/0058741 A1    Mar. 8, 2012

Related U.S. Application Data

(60) Division of application No. 11/358,917, filed on Feb. 20, 2006, now Pat. No. 8,072,117, which is a continuation of application No. PCT/US2004/027229, filed on Aug. 20, 2004.

(60) Provisional application No. 60/496,431, filed on Aug. 20, 2003.

(51) Int. Cl.
*H02N 10/00* (2006.01)
*H02N 2/00* (2006.01)

(52) U.S. Cl. .......................... 310/306; 310/324; 310/371

(58) Field of Classification Search ................... 310/306, 310/324, 371, 367, 369; 73/579, 570; 324/95, 324/96

See application file for complete search history.

(56) References Cited

U.S. PATENT DOCUMENTS

| 3,575,657 | A | * | 4/1971 | Dubrowsky et al. | ............. 324/95 |
| 5,452,878 | A | * | 9/1995 | Gravesen et al. | ........ 251/129.02 |
| 5,839,062 | A | | 11/1998 | Nguyen et al. | |
| 5,963,788 | A | * | 10/1999 | Barron et al. | ................... 438/48 |
| 6,174,820 | B1 | * | 1/2001 | Habermehl et al. | ........... 438/745 |
| 6,222,304 | B1 | | 4/2001 | Bernstein | |
| 6,271,052 | B1 | | 8/2001 | Miller et al. | |
| 6,605,487 | B2 | | 8/2003 | Franosch et al. | |
| 6,762,668 | B2 | | 7/2004 | Davis et al. | |
| 6,803,697 | B1 | * | 10/2004 | Ashkenazi | .................... 310/306 |

(Continued)

FOREIGN PATENT DOCUMENTS

WO    WO-2005020482 A2    3/2005

(Continued)

OTHER PUBLICATIONS

"U.S. Appl. No. 11/358,917, Non Final Office Action mailed Jan. 19, 2011", 10 pgs.

(Continued)

*Primary Examiner* — Sonny Trinh

(74) *Attorney, Agent, or Firm* — Schwegman, Lundberg & Woessner, P.A.

(57) ABSTRACT

A source signal is converted into a time-variant temperature field with transduction into mechanical motion. In one embodiment, the conversion of a source signal into the time-variant temperature field is provided by utilizing a microfabricated fast response, bolometer-type radio frequency power meter. A resonant-type micromechanical thermal actuator may be utilized for temperature read-out and demodulation.

19 Claims, 3 Drawing Sheets

U.S. PATENT DOCUMENTS

| | | | |
|---|---|---|---|
| 7,238,621 B2* | 7/2007 | Krishnamoorthy et al. | 438/745 |
| 7,566,582 B2 | 7/2009 | Tapalian et al. | |
| 7,587,895 B2* | 9/2009 | Naterer et al. | 60/512 |
| 7,812,502 B2 | 10/2010 | Zalautdinov et al. | |
| 2006/0238239 A1 | 10/2006 | Zalalutdinov et al. | |
| 2008/0143320 A1* | 6/2008 | Nicholson | 324/96 |

FOREIGN PATENT DOCUMENTS

WO   WO-2005020482 A3   3/2005

OTHER PUBLICATIONS

"U.S. Appl. No. 11/358,917, Notice of Allowance mailed Jul. 27, 2011", 6 pgs.

"U.S. Appl. No. 11/358,917, Response filed May 19, 2011 to Non Final Office Action mailed Jan. 19, 2011", 7 pgs.

"U.S. Appl. No. 11/358,917, Restriction Requirement mailed Mar. 22, 2010", 6 pgs.

"U.S. Appl. No. 11/358,917 Response to Restriction Requirements filed Apr. 22, 2010 to Restriction Requirement mailed Mar. 22, 2010", 6.

"Chinese Application Serial No. 200480030759.9, Office Action mailed Feb. 24, 2010", 6 pgs.

"Chinese Application Serial No. 200480030759.9, Office Action mailed May 8, 2009", 11 pgs.

"Chinese Application Serial No. 200480030759.9, Office Action mailed Jun. 1, 2010".

"Chinese Application Serial No. 200480030759.9, Response filed Jun. 11, 2010 to Office Action dated Feb. 24, 2010", (w/ English Translation of Claims), 10 pgs.

"European Application Serial No. 04786553.0, Office Action mailed Feb. 23, 2009", 2 pgs.

Baltes, H., et al., "Micromachined Thermally Based CMOS Microsensors", Proceedings of the IEEE, 86 (8), (Aug. 1998), 1660-1678.

Kazinczi, R., et al., "3-D Resonator Bridges as Sensing Elements", Sesens Workshop on Semiconductor Sensors, (Dec. 1, 2000), 804-805.

Reichenbach, R. B, "Resistively Actuated Micromechanical Dome Resonators", Proceedings of the SPIE—The International Society for Optical Engineering SPIE-INT, 5344 (1), (Jan. 27, 2004), 51-58.

Remtema, T., et al., "Active Frequency Tuning for Micro Resonators by Localized Thermal Stressing Effects", Sensors and Actuators A, 91 (3), Elsevier Sequoia, (Jul. 15, 2001), 332-338.

Stemme, G, "Resonant silicon sensors", J. Micromech. Microeng., 1, (1991), 113-125.

Stemme, G., "Resonant Silicon Sensors", Journal of Micromechanics & Microengineering, 1, IOP Publishing Ltd., (Jan. 1991), 113-125.

Syms, R. R. A, "Electrothermal Frequency Tuning of Folded and Coupled Vibrating Micromechanical Resonators", Journal of Micromechanical Systems, 7 (2), IEEE Inc., (Jun. 1998), 164-171.

Zalalutdinov, M., "Autoparametric Optical Drive for Micromechanical Oscillators", Applied Physics Letters, 79(5), (Jul. 30, 2001), 695-697.

Zalalutdinov, M., "Shell-type Micromechanical Oscillator", Proceedings of the SPIE, vol. 5116, (May 19, 2003), 229-236.

* cited by examiner

THERMAL-MECHANICAL SIGNAL PROCESSING

RELATED APPLICATION

This application is a Divisional of U.S. application Ser. No. 11/358,917, filed Feb. 20, 2006, which is a Continuation Under 35 U.S.C. §1.111(a) of International Application No. PCT/US2004/027229, filed Aug. 20, 2004 and published in English as WO 2005/020482 A3 on Mar. 3, 2005, which claims priority to U.S. Provisional Application Ser. No. 60/496,431 (entitled Method and Apparatus for Thermal-Mechanical Signal Processing, filed Aug. 20, 2003), which applications are incorporated herein by reference. This application also claims priority to U.S. Provisional Application Ser. No. 60/496,421 (entitled Shell-Type Micromechanical Actuator and Resonator, filed Aug. 20, 2003), and U.S. Provisional Application Ser. No. 60/496,430 (entitled Laser Annealing For MEMS Device, filed Aug. 20, 2003), which are incorporated herein by reference. This application is related to U.S. application Ser. No. 10/097,078 (entitled Heat Pumped Parametric MEMS Device, filed Mar. 12, 2002), which is incorporated herein by reference.

GOVERNMENT FUNDING

The invention described herein was made with U.S. Government support under Grant Number DMR0079992 awarded by the National Science Foundation. The United States Government has certain rights in the invention.

BACKGROUND

Many different methods exist for performing signal processing. In one form of signal processing, devices are used to separate carrier signals and extract base-band information from signals, such as broadcast signals. Prior devices consumed more power and space than desired, and were not easy to implement on a single-chip transceiver.

SUMMARY

A source signal is converted into a time-variant temperature field which is used to produce mechanical motion. In one embodiment, the conversion of a source signal into the time-variant temperature field is provided by utilizing a microfabricated fast response, bolometer-type radio frequency power meter. A resonant-type micromechanical actuator may be utilized for temperature read-out.

In one embodiment, partial or full signal processing necessary for separating a carrier, and extracting base-band information from a broadcast signal is accomplished. Thermal-mechanical processing is used for frequency reference generation and frequency modulation of the carrier signal by a base-band signal in a transmitter path. Power savings and the ability to implement such signal processing on a single-chip transceiver may be provided.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

Figure 1:
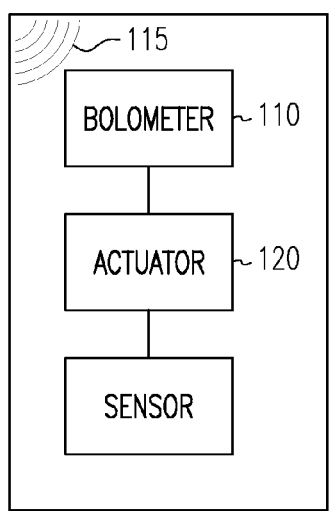
FIG. 1 is a block diagram of a signal processing device for converting heat into motion according to an example embodiment.

FIG. 1 is block diagram illustrating an example embodiment of a system 100 for converting a signal into mechanical motion. A bolometer 110, such as a micron or nanometer scale bolometer is used to receive RF signals 115. In one embodiment an antenna converts the RF electromagnetic signal into an electrical signal, which is then converted into heat, by the bolometer 110, such as by a small resistor. In further embodiments, the bolometer may be any type of device that receives RF electrical signals and converts it into heat. The bolometer 110 in one embodiment has an antenna that converts the RF signal into an electrical signal, which is then converted into heat, such as by a small resistor. In further embodiments, the bolometer may be any type of device that receives RF and converts it into heat. The bolometer 110 in one embodiment has a very small heat capacity, and exhibits heating/cooling rates well above the MHz frequency range. This enables high frequency thermal operation for RF signal processing. The bolometer may also be selected to provide mixing capabilities.

In order to detect the high frequency, small amplitude temperature oscillations of the bolometer 110, a thermo-mechanical actuator at 120 is used. In one embodiment, the bolometer 110 is placed in contact with the actuator 120, such to provide local temperature variations and hence local thermomechanical stress on the actuator. This causes the actuator 120 to exhibit distortions, resulting in detectable mechanical motion or displacement. Such motion is detected by a sensor 130. The motion is thus a function of the frequency of the signal that heats the bolometer 110.

The sensitivity of the thermal-to-mechanical transduction or induction can be enhanced by utilizing the resonant properties of the thermo-mechanical actuator. Matching the frequency of the temperature oscillations with a resonant frequency of the actuator provides an increase in the amplitude of the resulting mechanical motion by a factor Q, which describes the quality factor of the resonator. The resonant properties of the thermal actuator may also be employed to filter out unwanted frequency components of the incoming RF signal 115.

Figure 2A:
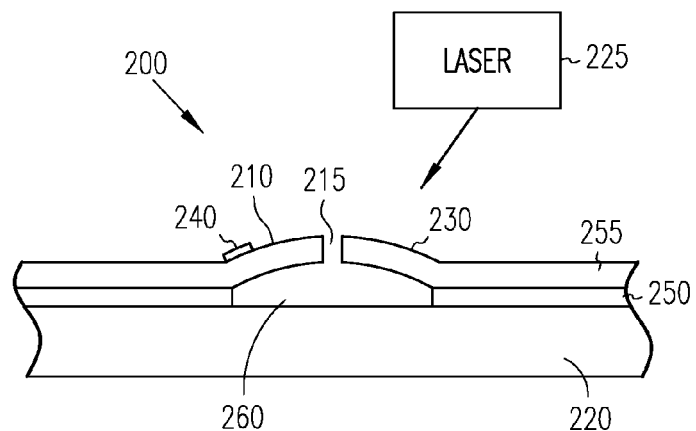
FIG. 2 is a block diagram showing an oscillating disc with a bolometer for converting heat into motion according to an example embodiment.
Figure 2B:
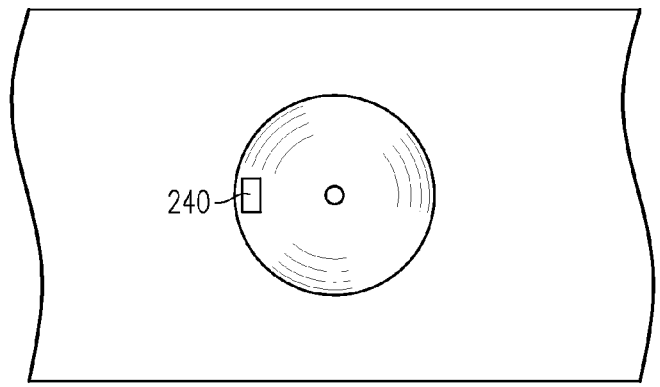

FIG. 2A is a side view representation of a micromechanical oscillator 200 that serves as an actuator 120 of FIG. 1. FIG. 2B is a top view. The oscillator 200 oscillates in the radio frequency (RF) range and is fabricated in the form of a concave membrane 210, which is generally circular or disc shape, and has a hole 215 proximate the center. The membrane is clamped on the periphery to the surrounding polysilicon film.

Other types of resonators may be used, such as discs supported by pillars, cantilevered beams, and other devices.

Oscillator 200 may be fabricated by growing an approximately 1 um layer of silicon oxide 250 on a surface of silicon wafer, or similar substrate 220. The oxide is used as a sacrificial layer. Polycrystalline silicon film 255 is then deposited on the surface of the oxide 250 by low pressure chemical vapor deposition (LPCVD) at 590° C. After the deposition, the wafer is annealed for approximately 15 minutes at approximately 1050° C. Photolithography, followed by a CF4 dry etch is used to create an approximately 2 um-diameter hole 215 through the top polysilicon layer 225.

After stripping off resist used in the lithography process, the structure is dipped into concentrated hydrofluoric acid (HF 49%). Dissolving the sacrificial silicon dioxide (etch rate approximately 1 um/minute) results in a suspended membrane-like structure with a hole in the center. The etching time determines the outer diameter of the cavity 260 underneath the polysilicon film. This is provided as one example of a method of making such an oscillator. As will be apparent to one of average skill, many of the parameters and materials may be varied significantly to make dome shaped oscillators.

If the polysilicon were stress-free, the released membrane would be flat. However, significant compressive stress incorporated in the polysilicon film as a result of deposition and annealing parameters makes the planar configuration unstable and leads to a buckled membrane. The resulting structure has a dome shape with a hold at the top. Using a critical point dry (CPD) process to avoid surface tension provides a high yield for the dome-type resonators, and prevents stiction of the membrane to the substrate.

A modified method of fabrication of the shell membrane 210 begins with a $CF_4$ plasma dry etch of the self aligned apex hole 215 in the device layer. The opened hole provides a way to dissolve an underlying 1.5 µm silicon dioxide layer 250 with hydrofluoric acid, creating a suspended membrane above the substrate. The resulting membrane 210 has non-zero curvature due to large compressive stress incorporated into the device layer through high temperature post process annealing. When the sacrificial silicon dioxide is released through the etch hole, the in-plane stress produces out of plane buckling, forming a shallow shell. The resonator used in the present study is a 200 nm thick polysilicon shallow spherical shell segment, 30 µm in diameter, projecting approximately 1 µm out of plane at the apex.

The out-of-plane component in the dome-like membrane significantly increases the resonant frequency several fold over a two dimensional structure. The natural frequency of a flat annulus clamped on the periphery and free in the center is described by $$f_{mn}\big|_{\substack{2D\\annular\\plate}} = \frac{\pi h}{2R^2}\sqrt{\frac{E}{3\rho(1-\nu^2)}}(\beta_{mn})^2 \tag{1}$$

where h is the polysilicon thickness, R is the radial projection of the plate, E is Young's modulus, ρ is the material density, υ is Poisson's Ratio, and β is a geometrical constant.

Shallow shell theory is used to derive equation 2 which accounts for the extra rigidity of the out of plain projection $$f_{mn}\big|_{\substack{shallow\\sphetrical\\shell}} = \left(f_{mn}^2\big|_{\substack{flat\\plate}} + \frac{E}{\rho(2\pi\chi)^2}\right)^{1/2} \tag{2}$$

where χ is the radius of curvature of the dome. The increased stiffness allows large radial dimension structures to achieve significantly higher frequencies. In particular, the aforementioned 30 µm diameter dome may display a 17.8 MHz $\gamma_{11}$ resonance with a quality factor of ~40,000. Numerical modeling suggests that deeper shells with smaller lateral dimensions have the potential to reach into the GHz range. Operation in air may occur; however, viscous damping forces over the large surface area reduce the Q to ~70.

A bolometer 240 or other type of resistive heating element is placed on the membrane 210 near the periphery in one embodiment. It may be placed in any position on a membrane that will result in a modulation of the vibration of the membrane in response to heating and cooling of the bolometer 240.

Transduction between electrical signals and mechanical motion is accomplished by creating a non-homogeneous thermal mechanical stress in the dome structure by means of the resistive heating element 240 dissipating Joule heat into the oscillator. The high rigidity of the dome structure allows use of a second layer of lithography to create a metallic resistor on the top of the prefabricated shell resonator. In one embodiment optical lithography is performed on the polysilicon, followed by image reversal in a YES oven. An electron gun evaporator is used to deposit a 5 nm titanium adhesion layer and a subsequent 20 nm film of gold on the polysilicon surface. Liftoff is performed with an acetone soak and IPA rinse. Since the presence of even a thin metallic layer increases dissipation of elastic energy in the moving structure, the quality factor of the resonator may be tailored by placing the heater at locations with different displacement amplitudes. At the same time, matching of the input impedance to that of the corresponding circuitry can be achieved by changing the geometry of the resistor. In one embodiment, the bolometer comprises a 50 Ω, 70×3 µm resistor 240 on the periphery of the dome, allowing the resonator to be undamped by the $2^{nd}$ layer metallization.

When a 20 mV signal is applied to the resistor, approximately 4 µW of Joule heat may be dissipated into the resonator. Adsorbed heat in the resonator produces thermal stress in the polysilicon device layer, and, due to coupling between the membrane and flexural components within the shell structure, this thermal stress produces significant out-of-plane deflections within the resonator. The fact that bending of the resonator is facilitated through the curved structure (rather than through differing expansion coefficients in multiple layers) reduces damping induced by lossy layers observed in bimorph resonators.

The process of heat diffusion within the resonator can be modeled by a one dimensional heat equation, $$u_n(r, t) = B_n \sin\left(\frac{n\pi r}{R}\right)e^{-\lambda_n t} \tag{3}$$

with time constant, $$\lambda_n = \frac{K}{C\rho}\left(\frac{n\pi}{R}\right)^2 \quad (4)$$

where K is the thermal conductivity, C is the heat capacity, R is the radius of a 2D plate, and n=2.4 is the root of a Bessel function $J_0(\mu_1^{(0)})=0$. Due to the micron size radius of the device, the cooling rate, $1/\lambda$, is on the order of microseconds, allowing high frequency modulation of the dissipated power through application of an AC signal to the resistor. When the frequency of the applied signal matches the natural frequency of the mechanical vibrations, $f_o$, provided that $1/\lambda<1/f_o$, detectable high amplitude vibration occurs.

The driving force, which is proportional to the power dissipated in the resistor, is, after removing 2f components:

$$F_{drive} \propto V_{DC} V_{AC} \sin(\omega_o t) \quad (5)$$

In the 30 μm domes, sufficient mechanical displacement may be obtained with a 20 mV AC signal, reducing power consumption of the transducer. Post production resonator tuning is possible by controlling the DC voltage level through the resistor. The 30 μm dome showed a (2 Hz/μW) dependence on the applied DC bias.

The vertical displacement of the vibrating shell is detected optically by measuring reflectivity of a 632.8 nm HeNe laser beam focused on the device in a $10^{-6}$ Torr vacuum chamber. The modulation of the reflected light, introduced by a moving Fabry-Perot interferometer (created by the substrate and the suspended structure) was detected by a New Focus 1601 high-speed photodetector and analyzed in an Agilent 4396B spectrum/network analyzer.

Figure 3:
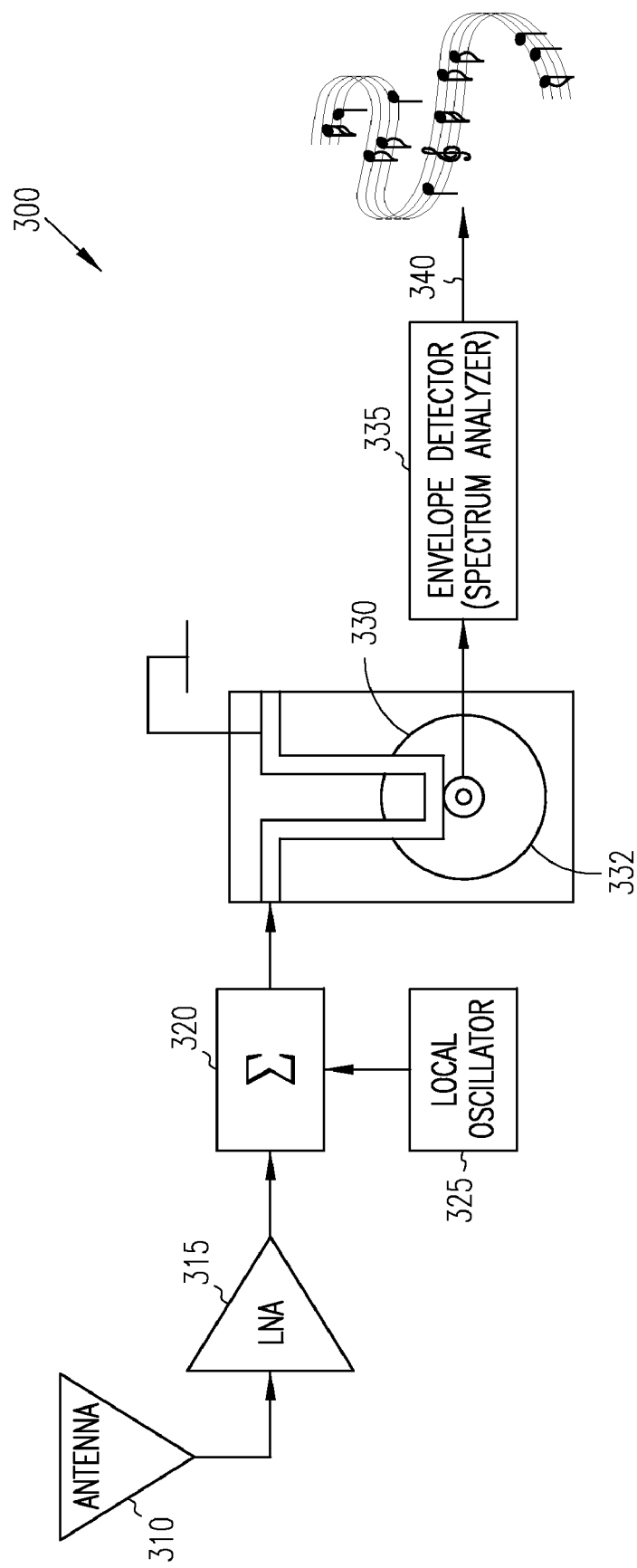
FIG. 3 is a block diagram showing an FM receiver using a microheater and resonator according to an example embodiment.

FIG. 3 is a block diagram of an FM radio receiver 300. An amplified signal received via and antenna 310 is linearly superimposed at 320 with a reference signal from a local oscillator 325. This combined signal is provided to a device 330 formed of a shell or dome type disc with a microheater formed on a downslope or periphery of the disc. The combined signal is used to modulate the temperature of the microheater 332, which in one embodiment comprises a metal resistive element that dissipates heat in response to electrical current.

In one embodiment, the amplified signal received via antenna 310 is amplified by 40 dB, and linearly superimposed with a 0 dB reference signal from the local oscillator 325. The local oscillator 325 is tuned to 87.2 MHz so that the frequency difference between a station of interest (97.3 MHz for example) would match a resonant frequency of the dome, ($f_{resonator}$=10.1 MHz). The dome resonator passes the down-converted signal within the $f_{resonator}/Q$ band, filtering out all unwanted carrier frequencies. Due to high quality factors (Q~3,000) of the dome, only a fraction ($\delta f_{FM}$~3 kHz) of the FM modulated ($\delta f$~100 kHz) signal passes through the thermo-mechanical filter. By positioning the upper or lower sloping skirt of the FM band at the dome resonant frequency, a slope detection method is provided to demodulate the FM carrier. The amplitude of the mechanical vibration, used as the output signal, becomes entangled with the frequency detuning of the FM signal and a simple envelope detector 335 is used to convert the resulting signal into audio 340. In one embodiment, the envelope detector comprises an interferometer focused on the disc. In further embodiments capacitive detection or piezoelectric detection methods may be employed.

Figure 4:
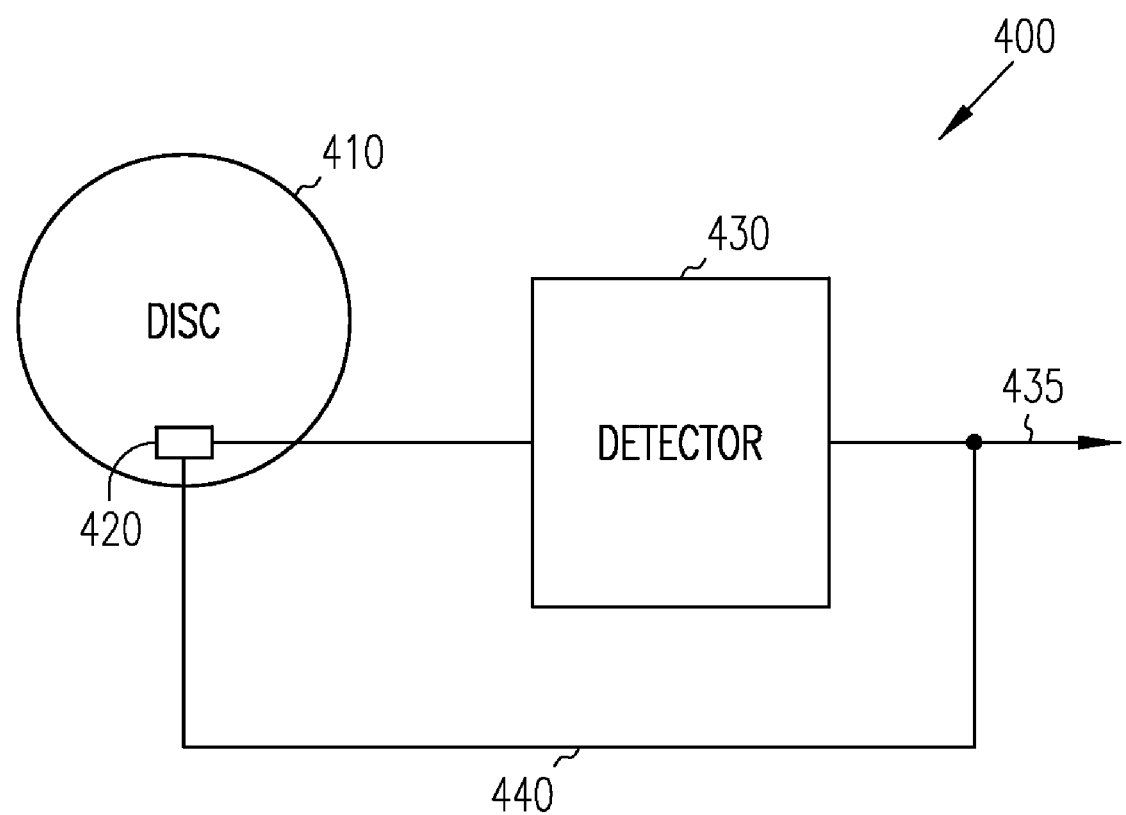
FIG. 4 is a block diagram of a frequency generator having a heat converting feedback loop according to an example embodiment.

FIG. 4 is a block diagram of a frequency generator 400. The frequency generator comprises a disc 410, such as a shell or dome, that vibrates at a selected desirable frequency. A heating/cooling element, such as a resistive bolometer 420 is thermally coupled to an edge or other desired portion of the disc 410 to cause the oscillation of the disc in response to temperature changes. A detector 430 provides an output signal 435 responsive to such oscillation of the disc. Output signal 435 is amplified, phase shifted and fed back along a feedback line 440 to the bolometer 420, providing a positive feedback loop. The disc becomes self-oscillating at a desired frequency. A self-sustained oscillation of the dome resonator is obtained with frequency stability of 1.5 ppm.

The bolometer and actuator may also serve as a RF signal demodulator. In other words, thermally driven MEMS resonators can simulate development of new methods of modulation applied to a carrier signal for information broadcasting. In one configuration, RF amplitude-modulated (AM) signals are applied directly to the micro-fabricated resistive heater or bolometer. If the thermal inertia of the bolometer is small enough ($1/f_{carrier} \ll \tau_{cool} \ll 1/f_{modul}$), the temperature of the bolometer will follow the modulation of the RF power (i.e. AM) while being unaffected by the carrier frequency and thus, carry all the base band information.

Another method of thermal signal processing, mimicking a superheterodyne RF receiver, is achieved by employing an intrinsic nonlinearity of the resistive bolometer. The temperature modulation is determined by the power of the RF signal and hence by the square of the applied voltage. When a superposition of AC voltages at different frequencies is applied to the ohmic heater, the resulting thermal oscillations appear at frequencies equal to linear combinations of the input signals. This allows the resistive bolometer to perform as a frequency mixer:

$$\Delta T_{BOLOMETER} \sim P_{DISSIPATED} = (V_1 \sin t(\omega_1 t) + V_2 \sin(\omega_2 t))^2 = V_1^2/2 - V_1^2/2 \cdot \cos(2\omega_1) + V_1 V_2 \cos(\omega_1 - \omega_2) - V_1 V_2 \cos(\omega_1 - \omega_2) - \frac{1}{2} \cdot V_2^2 \cos(2\omega_2 t) + V_2^2/2$$

Components at $f_{up} = \omega_1 + \omega_2$ and $f_{down} = \omega_1 - \omega_2$ are referred to as "up" and "down" converted signals. Applying a combination of the signal of interest at $\omega_1$ and the signal from a local oscillator at $\omega_2$ to the bolometer and choosing the thermal intertia of the bolometer as $1/f_{up} \ll \tau_{cool} \ll 1/f_{down}$, thermal oscillations only at the frequency $f_{down}$ are produced, an analog to an intermediate frequency (IF) in a superheterodyne receiver.

In order to detect the down-converted component of the RF signal, small amplitude temperature oscillations of the bolometer are converted into mechanical motion by using a micro-fabricated thermo-mechanical actuator, such as a shell or dome oscillator. In one embodiment, the bolometer or resistive heater is placed on a slope of a micro-fabricated dome-type structure. RF signals are applied to it. Local variations of the dome result in detectable mechanical motion, such as by an interferometer.

The sensitivity of the thermal-to-mechanical transduction can be enhanced greatly if resonant properties of the thermo-mechanical actuator are employed. By matching the frequency of the temperature oscillations with a resonant frequency of the actuator, the amplitude of the resulting motion is amplified by the factor Q, which describes the quality factor of the resonator. The resonant properties of the thermal actuator are also employed to filter out unwanted frequency components of the incoming RF signal. Parametric amplification may also be employed by pumping the actuator at twice its resonant frequency.

A time dependent envelope of the mechanical vibration amplitude represents the base-band information for both amplitude modulated (AM) and frequency modulated (FM) signals. For FM signals, the width of the resonant peak of the thermo-mechanical actuator is narrower or comparable to the band of the FM broadcast. Variation of the modulation frequency shifts the frequency of the thermal oscillations within the mechanical resonant peak and hence affects the amplitude of the mechanical vibrations. Thus, the thermo-mechanical actuator-resonator can perform as a combination of a filter (IF filter in particular) and demodulator. After converting the mechanical motion of the actuator into an electrical signal, it can be applied to a hearing device or base-band electronics for further processing. The radio receiver 300 is a practical example of an FM radio receiver.

In a further example embodiment, dome-shaped, radio frequency, micromechanical resonators are with integrated thermo-elastic actuators. Such resonators can be used as the frequency-determining element of a local oscillator or as a combination of a mixer and IF filter in a superheterodyne transceiver.

CONCLUSION

A MEMS-based method and apparatus may be used to implement mixing, filtering, demodulation, frequency reference and frequency modulation. A method and apparatus are provided by converting a source signal into a time-variant temperature field with consequent transduction into mechanical motion. In one embodiment, the first conversion (signal into temperature) is provided by utilizing a micro-fabricated fast response, bolometer type radio frequency power meter. A resonant type micromechanical thermal actuator is utilized for temperature read-out, filtering and demodulation.

The method may be applied to a wireless communication device, and can accomplish partially or in full, the signal processing necessary for separating the carrier and extracting base-band information from the broadcast signal. Similar thermal mechanical processing can be used for frequency reference generation and frequency modulation of the carrier signal by a base-band signal in the transmitter path. The primary benefits are savings in power consumption, reduced size of components and single-chip transceiver solutions.

Converting an RF signal into heat and measuring the resulting temperature rise constitute a basic bolometric method for measuring RF power. Micron-size and nano-scale bolometers provide heating/cooling rates well above MHz frequency range and enable high frequency thermal operation for RF signal processing.

A heat actuated mixer and mechanical resonator device may be implemented in a wireless communicating device that eliminates the necessity of bulky off-chip components, and shrinks dimensions drastically. A low power PHEAT-30 uW for 10 MHz dome-type device) and low voltages used to operate the device may be very beneficial in such microminiaturized wireless communicating devices. The low impedance of the ohmic drive may simplify RF matching considerably.

In one embodiment, the dome resonators, comprise shallow shell segments clamped on the periphery. They may be fabricated utilizing pre-stressed thin polysilicon film over sacrificial silicon dioxide. The shell geometry enhances the rigidity of the structure, providing a resonant frequency several times higher than a flat membrane of the same dimensions. The finite curvature of the shell also couples out-of-plane deflection with in-plane stress, providing an actuation mechanism. Out-of-plane motion is induced by employing non-homogeneous, thermomechanical stress, generated in plane by local heating. A metal resistor, lithographically defined on the surface of the dome, provides thermal stress by dissipating heat. The diminished heat capacity of the MEMS device enables a heating/cooling rate comparable to the frequency of mechanical resonance and allows operation of the resonator by applying AC current through the microheater. Resistive actuation can be readily incorporated into integrated circuit processing and provides significant advantages over traditional electrostatic actuation, such as low driving voltages, matched impedance, and reduced cross talk between drive and detection.

The shell type resonator is but one example of a resonator for temperature readout. Example resonators that will couple to the thermal actuator may be in the form of a cantilever, disk supported by a pillar or a clamped beam. Still further resonators will be apparent to those of skill in the art after reading the detailed description.

The invention claimed is:

1. A method of signal processing for extracting base-band information from a broadcast signal, the method comprising:
   converting a radio frequency signal into heat; and
   measuring temperature changes representative of the radio frequency signal including converting the temperature changes into mechanical motion.

2. The method of claim 1 wherein a micro-fabricated thermo-mechanical actuator is to convert the temperature changed into mechanical motion.

3. The method of claim 2 wherein the actuator has a resonant frequency that matches the frequency of the temperature changes.

4. The method of claim 1 wherein the broadcast signal is in the radio frequency range.

5. A method of signal processing for extracting base-band information from an amplitude modulated broadcast signal, the method comprising:
   converting the amplitude modulated broadcast signal into heat using a micro-fabricated resistive heater having a thermal inertia small enough to follow the modulation; and
   measuring temperature changes in the micro-fabricated resistive heater.

6. The method of claim 5 wherein oscillations in the heat are converted into mechanical motion.

7. The method of claim 6 wherein a micro-fabricated thermo-mechanical actuator is used for converting heat into mechanical motion.

8. The method of claim 7 wherein the micro-fabricated thermo-mechanical actuator has a resonant frequency that matches the frequency of the temperature changes.

9. The method of claim 5 wherein the broadcast signal is in the radio frequency range.

10. A method comprising:
    converting a broadcast signal into temperature oscillations; and
    converting the temperature oscillations into mechanical motion representative of the broadcast signal.

11. The method of claim 10 wherein converting the temperature oscillations into mechanical motion is performed by an actuator having a resonant frequency that approximately matches the frequency of temperature oscillations.

12. The method of claim 11 and further comprising filtering unwanted frequency components as a function of the resonant frequency approximately matching the frequency of temperature oscillations.

13. The method of claim 10 wherein the broadcast signal is converted into temperature oscillations by a micro-fabricated resistive heating element.

14. The method of claim 13 wherein the heating element is a bolometer.

15. The method of claim 10 wherein converting the temperature oscillations into mechanical motion is performed by a dome type micro-fabricated oscillator.

16. The method of claim 10 and further comprising separating a carrier from a broadcast signal represented by the mechanical motion.

17. The method of claim 16 and further comprising extracting base-band information from the broadcast signal represented by the mechanical motion.

18. The method of claim 10 wherein the method is implemented on a single semiconductor chip.

19. The method of claim 10 wherein the broadcast signal is in the FM band, and wherein an FM carrier is demodulated using slope detection.

* * * * *